United States Patent
Aichi (10) Patent No.: US 11,194,248 B2
(45) Date of Patent: Dec. 7, 2021

(54) METHOD OF MANAGING IMPRINT APPARATUS, IMPRINT APPARATUS, METHOD OF MANAGING PLANARIZED LAYER FORMING APPARATUS, AND METHOD OF MANUFACTURING ARTICLE

(71) Applicant: CANON KABUSHIKI KAISHA, Tokyo (JP)

(72) Inventor: Shintaro Aichi, Utsunomiya (JP)

(73) Assignee: CANON KABUSHIKIKAISHA, Tokyo (JP)

( * ) Notice: Subject to any disclaimer, the term of this patent is extended or adjusted under 35 U.S.C. 154(b) by 231 days.

(21) Appl. No.: 16/368,960

(22) Filed: Mar. 29, 2019

(65) Prior Publication Data
US 2019/0302613 A1    Oct. 3, 2019

(30) Foreign Application Priority Data

Apr. 2, 2018 (JP) .............................. JP2018-071042

(51) Int. Cl.
  *G03F 7/00* (2006.01)
  *G03F 7/20* (2006.01)
  *B82Y 10/00* (2011.01)
  *B82Y 40/00* (2011.01)

(52) U.S. Cl.
  CPC ........ *G03F 7/0002* (2013.01); *G03F 7/70716* (2013.01); *B82Y 10/00* (2013.01); *B82Y 40/00* (2013.01)

(58) Field of Classification Search
  CPC ... G03F 7/0002; G03F 7/70716; B82Y 10/00; B82Y 40/00
  See application file for complete search history.

(56) References Cited

U.S. PATENT DOCUMENTS

| 8,202,463 B2 * | 6/2012 | Yoneda | G03F 7/0002 264/293 |
| 2010/0078846 A1 * | 4/2010 | Resnick | B82Y 10/00 264/101 |
| 2015/0174816 A1 * | 6/2015 | Mizuno | B29C 59/002 264/101 |
| 2017/0185074 A1 * | 6/2017 | Asada | B05D 3/12 |
| 2020/0078846 A1 * | 3/2020 | Zhou | B21D 24/005 |

FOREIGN PATENT DOCUMENTS

JP    H09280640 A    10/1997

* cited by examiner

*Primary Examiner* — Nahida Sultana
(74) *Attorney, Agent, or Firm* — Rossi, Kimms & McDowell LLP (57) ABSTRACT

There is provided a method of managing an imprint apparatus that comprises a processor configured to execute an imprint process for forming a layer of an imprint material on a substrate by using a mold, a chamber configured to accommodate the processor, and a chemical filter configured to remove a chemical impurity contained in a gas flowing inside the chamber. The method comprises retaining a test substrate inside the chamber during execution of the imprint process, forming a layer of an imprint material on the test substrate by executing the imprint process on the test substrate by the processor after the retaining, inspecting the layer formed on the test substrate in the forming, and determining whether or not to replace the chemical filter based on an inspection result obtained in the inspecting.

10 Claims, 9 Drawing Sheets

FIG. 3A
TIME OF IMPRINT MATERIAL SUPPLY

FIG. 3B
DURING CONTACT

FIG. 3C
AFTER CONTACT

METHOD OF MANAGING IMPRINT APPARATUS, IMPRINT APPARATUS, METHOD OF MANAGING PLANARIZED LAYER FORMING APPARATUS, AND METHOD OF MANUFACTURING ARTICLE

BACKGROUND OF THE INVENTION

Field of the Invention

The present invention relates to a method of managing an imprint apparatus, an imprint apparatus, a method of managing a planarized layer forming apparatus, and a method of manufacturing an article.

Description of the Related Art

An imprint technique for forming an imprint material pattern on a substrate by using a mold is being put into practice as one of lithography techniques each for manufacturing an article such as a semiconductor device. As for the imprint technique, there has been proposed a photo-curing method which cures an imprint material by using light. In this method, a mold is brought into contact with an imprint material on a substrate and the imprint material is irradiating with light in this state so that the imprint material is cured. After that, the mold is separated from the cured imprint material.

The space in which such an imprint process is executed is formed in a clean chamber. The inside of the clean chamber is managed by air conditioning such that chemical impurities have been removed by using a chemical filter. The impurity removal performance of the chemical filter decreases as it is used, and the filter reaches the end of its life. If the chemical filter is not replaced and continues to be used with the decreased impurity removal performance, the substrate surface will be contaminated with impurities. This impairs the fluidity of an imprint material so the imprint material is not uniformly filled between the substrate and the mold, resulting in generation of pattern defects.

Accordingly, it is necessary to replace the chemical filter at an appropriate time. If the chemical filter is replaced periodically, it will be replaced before it reaches the end of its life, resulting in waste. Therefore, it is conceivable to measure the concentration of impurities and determine the replacement timing based on the measurement result (for example, Japanese Patent Laid-Open No. 9-280640). In this case, a sample gas is generally collected and analyzed, but the analysis takes a long time and the cost of analysis increases. Therefore, in an exposure apparatus, fogging of an optical component such as a lens or a mirror is periodically measured, and the replacement timing is determined based on the measurement result.

However, in an imprint apparatus, the wavelength of a light source used for curing an imprint material is longer than those of an KrF laser or an ArF laser, and the energy is small. Therefore, fogging of an optical component hardly occurs so that it is difficult to determine the degradation of the chemical filter by measuring fogging.

SUMMARY OF THE INVENTION

The present invention provides, for example, an advantageous technique for highly accurately determining whether or not to replace a chemical filter in an imprint apparatus.

The present invention in its one aspect provides a method of managing an imprint apparatus that comprises a processor configured to execute an imprint process for forming a layer of an imprint material on a substrate by using a mold, a chamber configured to accommodate the processor, and a chemical filter configured to remove a chemical impurity contained in a gas flowing inside the chamber, the method comprising retaining a test substrate inside the chamber during execution of the imprint process, forming a layer of an imprint material on the test substrate by executing the imprint process on the test substrate by the processor after the retaining, inspecting the layer formed on the test substrate in the forming, and determining whether or not to replace the chemical filter based on an inspection result obtained in the inspecting.

Further features of the present invention will become apparent from the following description of exemplary embodiments (with reference to the attached drawings).

DESCRIPTION OF THE EMBODIMENTS

Various exemplary embodiments, features, and aspects of the invention will be described in detail below with reference to the drawings.

Embodiments of the present invention will be described in detail with reference to the accompanying drawings. Note that the following embodiments are merely detailed practical examples of the present invention, and the present invention is not limited to the following embodiments. All combinations of the features to be described in the embodiments are not essential for solving the problem of the present invention.

First, the outline of an imprint apparatus according to an embodiment will be described. The imprint apparatus is an apparatus for bringing an imprint material supplied onto a substrate into contact with a mold, applying curing energy to the imprint material, and forming a pattern of the cured product to which a concave/convex pattern of the mold is transferred.

As an imprint material, a curable composition (to be also referred to as an uncured resin) to be cured by receiving the curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, visible light, and ultraviolet light. The curable composition can be a composition cured with light irradiation or heating. Among these compositions, the photo-curable composition cured by light irradiation contains at least a polymerizable compound and a photopolymerization initiator, and may further contain a non-polymerizable compound or a solvent, as needed. The non-polymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film obtained by connecting a plurality of droplets supplied by the imprint material supplier. The viscosity (the viscosity at 25° C.) of the imprint material can be, for example, 1 mPa·s (inclusive) to 100 mPa·s (inclusive). Examples of the substrate material can be glass, a ceramic, a metal, a semiconductor, a resin, and the like. A member made of a material different from the substrate may be formed on the surface of the substrate, as needed. Examples of the substrate can be a silicon wafer, a compound semiconductor wafer, and silica glass.

First Embodiment

Figure 1:
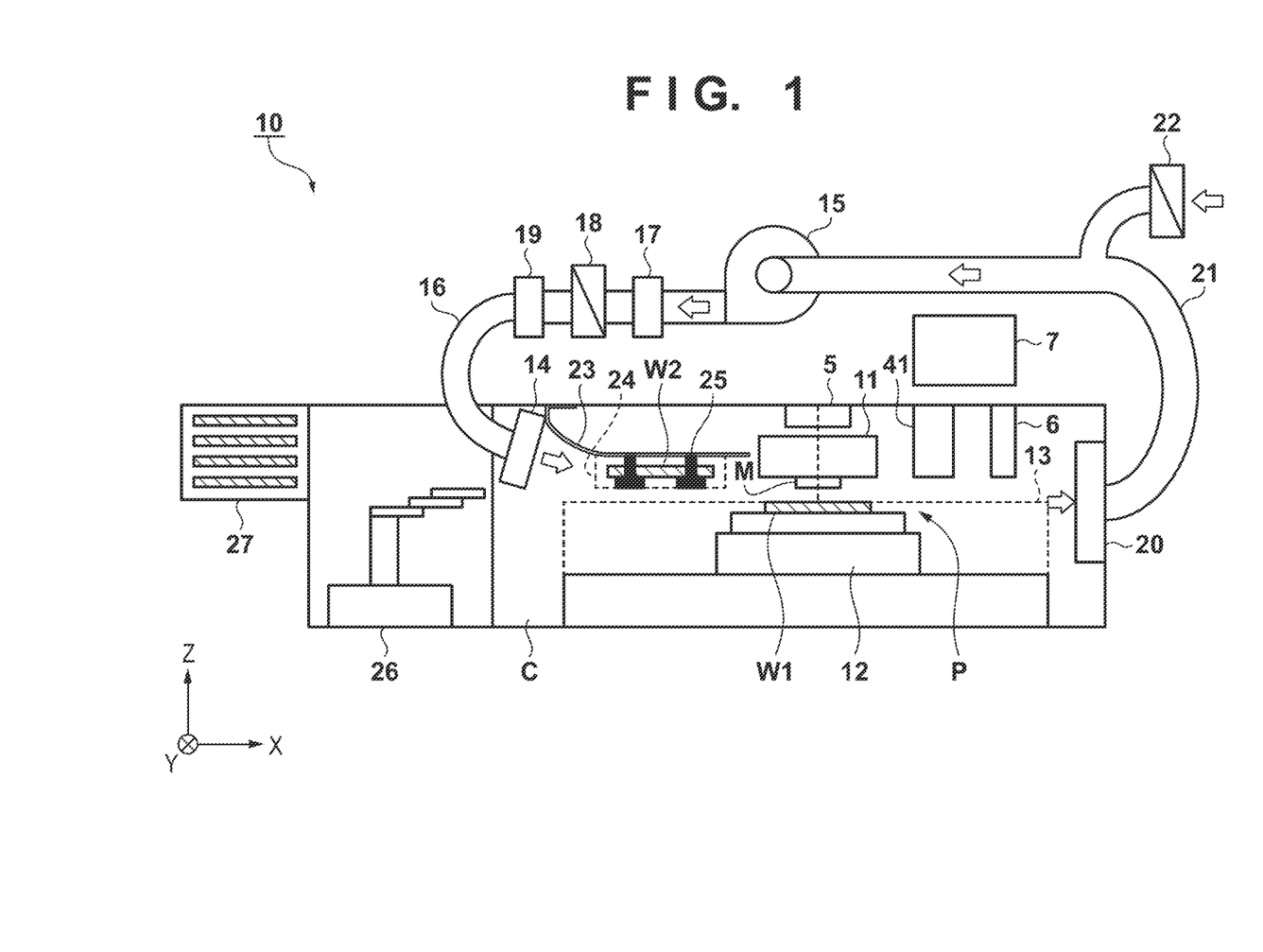
FIG. 1 is a view showing the arrangement of an imprint apparatus according to the first embodiment.

FIG. 1 is a view showing the arrangement of an imprint apparatus 10 according to the first embodiment. Note that in this specification and the accompanying drawings, directions are shown in an X-Y-Z coordinate system in which directions parallel to the surface of a substrate W are assumed to be on an X-Y plane. In this embodiment, the imprint apparatus 10 employs a photo-curing method for curing the imprint material with irradiation of ultraviolet light as the imprint material curing method. Note that the imprint apparatus 10 is not limited to this, and it can employ, for example, a heat-curing method which uses a thermosetting imprint material and cures it by heating.

A mold M having a pattern formed thereon is conveyed by a mold conveying system (not shown) and held by a mold head 11. The mold head 11 includes a drive mechanism that holds the mold M and drives it in the Z-axis direction. The mold head 11 may further include a drive mechanism that holds the mold M and drives it in a direction other than the Z-axis direction. The mold M has, for example, a rectangular outer shape and is made of a material (such as quartz) that transmits ultraviolet light. The substrate W can include a single-crystal silicon wafer, an SOI (Silicon on Insulator) wafer, a glass wafer, a mask, or the like.

A substrate W1 is loaded into the apparatus by a conveying device 26 and held on a stage 12. The stage 12 is movable within a stage movable region 13. A dispenser 41 is an imprint material supply device for supplying an uncured imprint material onto a substrate.

A curing device 5 irradiates the imprint material on the substrate W1 with ultraviolet light through the mold head 11 and the mold M to cure the imprint material. A processor P includes the mold head 11 and the stage 12 and executes an imprint process. In an imprint process, an imprint material pattern is formed on a substrate by using a mold. More specifically, an imprint process includes supplying an uncured imprint material onto a substrate by the dispenser 41, bringing a mold into contact with the imprint material, curing the imprint material in this state, and separating the mold from the cured imprint material.

The processor P is accommodated in a chamber C. A clean gas is constantly supplied into the chamber C by an air conditioning function. In the example shown in FIG. 1, a blowout portion 14 is provided in the supply port formed in the chamber C. A gas from which particles have been removed by a particle filter (not shown) is blown out from the blowout portion 14 into the chamber C. The gas moves in an air supply path 16 by a blower 15 and is blown out from the blowout portion 14. A cooler 17 for cooling the gas, a chemical filter 18 for removing chemical impurities contained in the gas, and a heater 19 for heating the gas are arranged in the air supply path 16. For example, a temperature sensor (not shown) is arranged on the downstream side of the heater 19, and the heater 19 can be controlled so that the temperature detected by the temperature sensor reaches a target temperature.

An exhaust portion 20 exhausts the gas flowing inside the chamber C to the outside of the chamber C. The exhaust portion 20 is arranged, for example, to face the blowout portion 14. The gas exhausted from the exhaust portion 20 is returned to the suction port of the blower 15 via an exhaust path 21. At the midway of the exhaust path 21 between the exhaust portion 20 and the blower 15, there is provided a merging portion where the outside air having passed through a second chemical filter 22 joins, so that the outside air from which impurity components have been removed is sucked into the blower 15.

Note that the arrangement order of the cooler 17, the chemical filter 18, and the heater 19 in the air supply path 16 can be appropriately changed. The cooler 17 may be arranged in the exhaust path 21. As for the heater 19, a plurality of heaters 19 may be arranged in series. Note that a circulation path is formed in the example shown in FIG. 1, but all the conditioned air blown into the chamber C may be sucked from outside air. The chemical filter 18 removes chemical impurities contained in the gas flowing inside the chamber C, and may be arranged anywhere in the gas flow path as long as it exerts its function. The chemical filter 18 may be provided inside the chamber C instead of in the air supply path 16.

In this embodiment, a retaining portion 24 for retaining a test substrate W2 during execution of an imprint process is provided inside the chamber C. The retaining portion 24 is provided, for example, at a position outside the stage movable region 13 between the blowout portion 14 and the processor P. Further, the retaining portion 24 is preferably provided at a position aligned with the processor P along the airflow formed by the gas from the blowout portion 14. This makes it possible to make the flow velocity of the gas flowing along the test substrate W2 retained in the retaining portion 24 substantially equal to the flow velocity of the gas flowing along the substrate W1 held on the stage 12 of the processor P. In addition, the retaining portion 24 is preferably arranged at a position upstream of the dispenser 41 with respect to the airflow formed by the gas blown out from the blowout portion 14. This is because when the retaining portion 24 is arranged at a position downstream of the dispenser 41, the mist of the imprint material from the dispenser 41 may be guided by the airflow and adheres to the test substrate W2 in the retaining portion 24.

Figure 2:
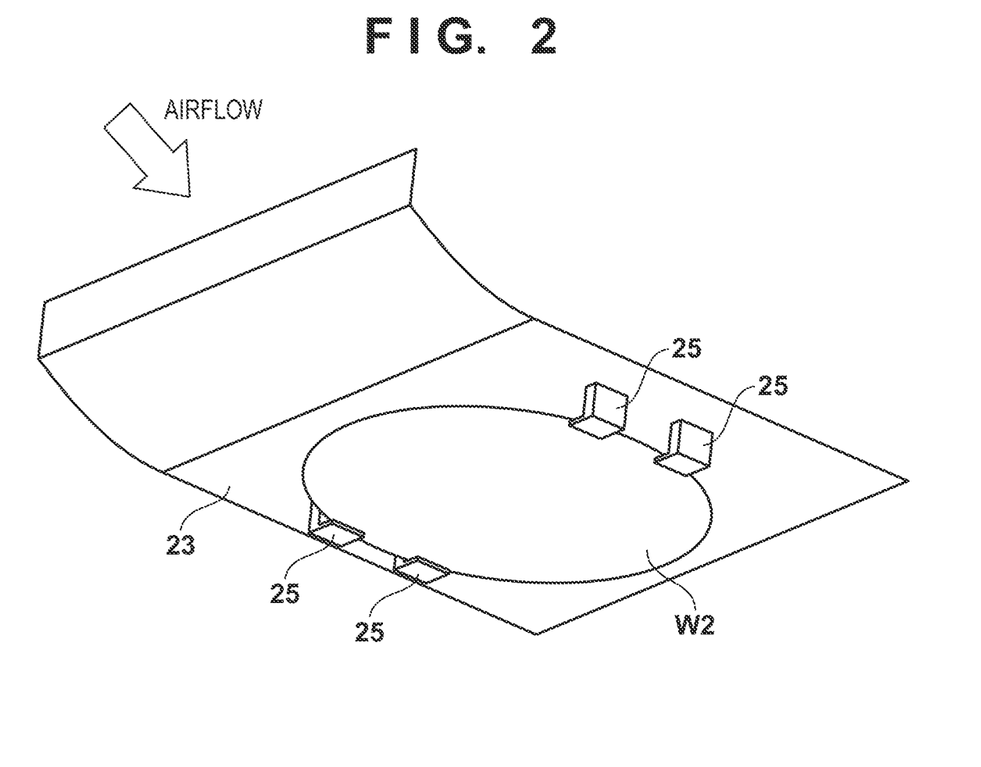
FIG. 2 is a view showing an arrangement example of a retaining portion.

In an example, an air guide plate 23 for guiding the gas blown out from the blowout portion 14 to the imprint space of the processor P is provided inside the chamber C. The retaining portion 24 may be provided at the air guide plate 23. FIG. 2 is a view showing an arrangement example of the retaining portion 24 provided at the air guide plate 23, and is a perspective view seen from the lower surface side of the test substrate W2. A plurality of support members 25 for supporting and suspending the outer peripheral portion of the lower surface of the test substrate W2 are attached to the air guide plate 23. The plurality of support members 25 are arranged so as not to obstruct the flow of the gas striking the test substrate W2. For example, the plurality of support members 25 are preferably arranged so that the loading/unloading direction of the test substrate W2 is in a direction along the airflow.

The conveying device 26 can load/unload the substrate W1 to/from the stage 12 and load/unload the test substrate W2 to/from the retaining portion 24. A substrate storage portion 27 stores unprocessed or processed substrates and test substrates. The conveying device 26 is configured to be able to access the substrate in the substrate storage portion 27.

An inspection device 6 inspects the defect of the imprint material pattern formed on the test substrate W2. For example, the inspection device 6 irradiates a substrate to be inspected with illumination light while scanning the substrate, thereby irradiating the entire surface of the substrate with the illumination light and capturing an image of the entire surface of the substrate. Since the illumination light is scattered when it hits a defective portion, it is possible to evaluate the position and size of the defect by analyzing the captured image reflecting the scattering. Note that the inspection device 6 may be arranged outside the imprint apparatus 10 as a device independent of the imprint apparatus 10.

A controller 7 controls the above-described respective devices of the imprint apparatus 10, and controls the operation of the imprint apparatus 10. Further, the controller 7 can process a captured image transferred from the inspection device 6 to evaluate the position and size of the defect. The controller 7 may be formed by a dedicated processor such as an ASIC or by a general-purpose computer including a CPU and a memory.

Figure 3A:
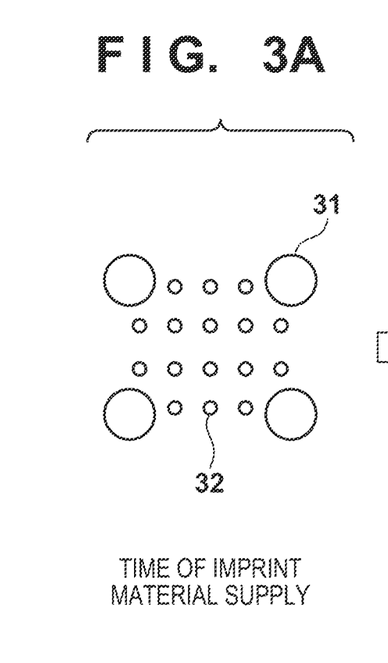
FIGS. 3A to 3C are views schematically showing a process in which unfilled defects are generated on a substrate.
Figure 3B:
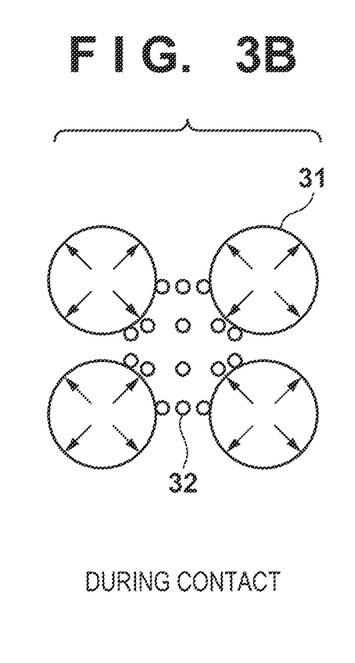
Figure 3C:
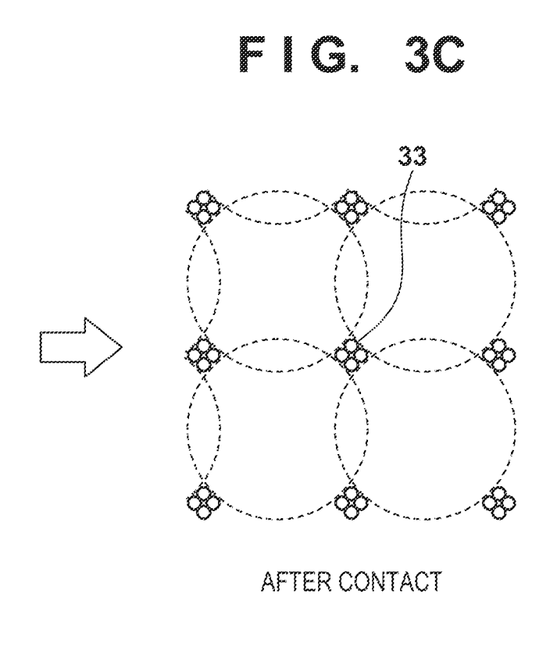

The arrangement of the imprint apparatus 10 according to this embodiment is generally as described above. As the use of the imprint apparatus 10, the impurity removal performance of the chemical filter 18 decreases. When the surface of the test substrate W2 is contaminated with impurities due to a decrease in impurity removal performance of the chemical filter 18, defects (unfilled defects) due to non-filling of the imprint material are generated. FIGS. 3A to 3C are views schematically showing a process in which unfilled defects are generated on a substrate when an imprint process is executed using a test mold (blank mold). When the impurity removal performance of the chemical filter 18 decreases, impurities adhere to the substrate. FIG. 3A shows a scene in which an imprint material 31 is supplied by the dispenser 41 in a state in which impurities 32 not dissolved in the imprint material exist on the substrate. In FIG. 3A, the impurities are schematically shown as discrete grains, but in practice, they adhere uniformly to the surface layer of the substrate. FIG. 3B shows a state in which a test mold (for example, a blank mold without a pattern) is being brought into contact with the imprint material on the substrate. By pressing the imprint material with the blank mold without a pattern, the imprint material 31 spreads uniformly. At this time, since the impurities 32 are not dissolved in the imprint material 31, they are pushed and moved by the imprint material 31 and gather. FIG. 3C shows a state in which filling of the imprint material is completed by contact between the test mold and the imprint material on the substrate. By gathering of the impurities that do not dissolve in the imprint material, filling of the imprint material is obstructed and unfilled defects 33 are generated. The larger the amount of the impurities 32 adhering to the substrate surface, the greater the influence of obstruction of filling of the imprint material, and as a result, the unfilled defect 33 tends to become larger. Accordingly, it is necessary to evaluate the state of the chemical filter 18 and replace it at an appropriate time.

Figure 4:
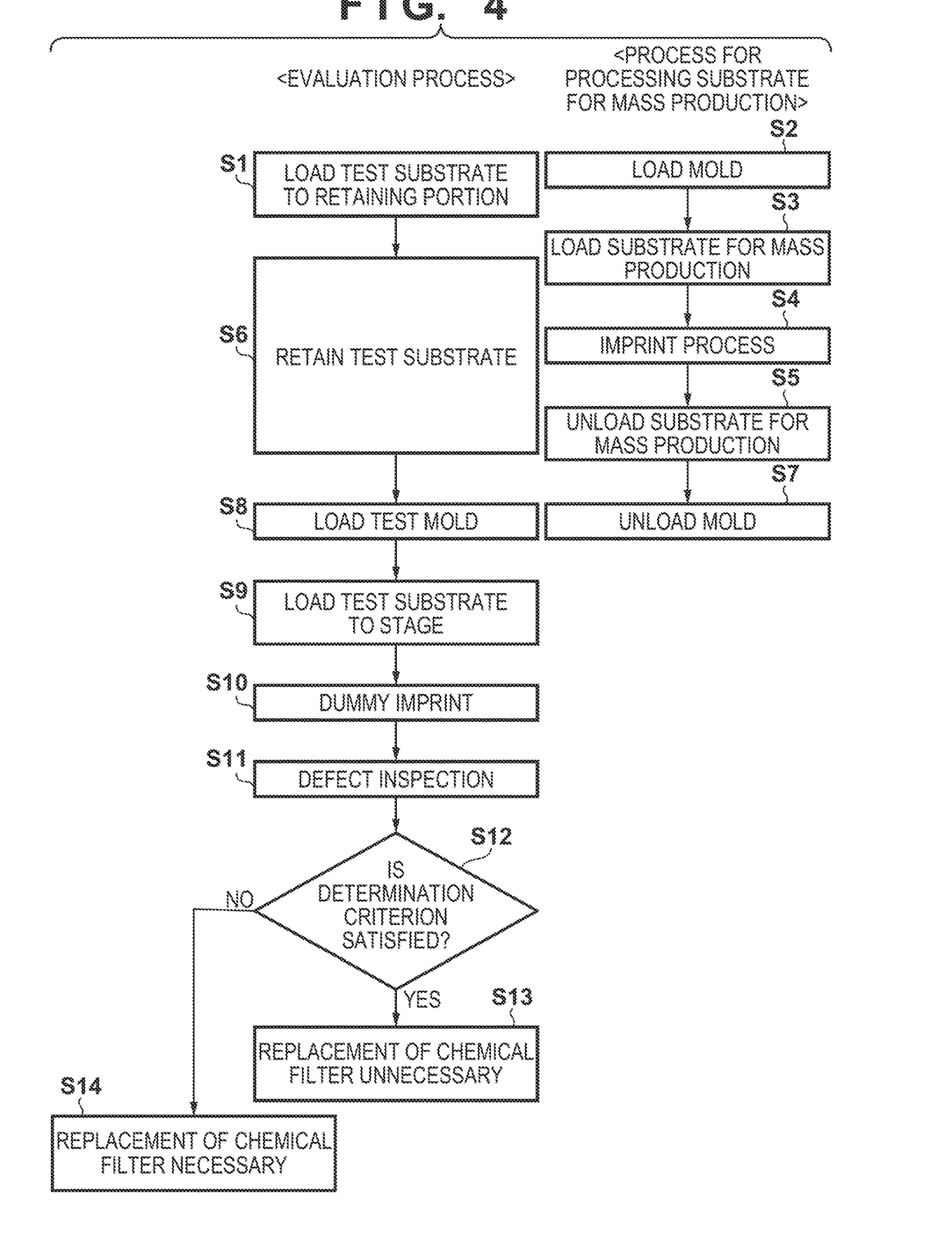
FIG. 4 is a flowchart of a method of managing the imprint apparatus according to the first embodiment.

FIG. 4 is a flowchart of a method of managing the imprint apparatus according to this embodiment. This management method can be controlled by, for example, the controller 7. As will be described below, this management method can be performed in parallel with a process for processing a substrate for mass production.

First, in S1, the test substrate W2 is loaded into the chamber C by the conveying device 26 and sent to the retaining portion 24, and the test substrate W2 is supported by the retaining portion 24. Here, it is assumed that an adhesion layer is applied in advance on the test substrate W2. Note that the adhesion layer refers to the outermost surface layer formed on the substrate surface in advance before supplying an imprint material for forming a pattern on the substrate, and it can also include a layer for improving the smoothness of the substrate surface.

Next, an imprint process for a substrate for mass production is executed as described below. In S2, the mold M is loaded into the chamber C by the mold conveying system (not shown) and held by the mold head 11. Then, in S3, the substrate W1 for mass production is taken out from the substrate storage portion 27 by the conveying device 26, loaded into the chamber C, and placed on the stage 12, so that the substrate W1 is held on the stage 12. In S4, an imprint process is executed on the substrate W1. When a plurality of shot regions are formed on the substrate W1, the imprint process is executed on each of the plurality of shot regions. After that, the substrate W1 having undergone the imprint process is unloaded from the chamber C by the conveying device 26 and stored in the substrate storage portion 27. Steps S3 to S5 can be repeatedly executed for a plurality of substrates.

During execution of at least the imprint process in S4 out of the above-described steps S2 to S5, the test substrate W2 is held in the retaining portion 24 and retained in the chamber C in S6. While the test substrate W2 is retained in the chamber C, steps S3 to S5 may be repeatedly executed for a plurality of substrates. In this way, the test substrate W2 is exposed to the same environment as the substrate W1 for mass production on which the imprint process is executed. As described above, at this time, if the impurity removal performance of the chemical filter 18 has decreased, the surfaces of the substrate W1 for mass production and the test substrate W2 are contaminated with impurities, and the possibility of causing defects due to non-filling of the imprint material increases.

After completion of a series of imprint processes for all the planned substrates, the mold M is removed from the mold head 11 and unloaded from the chamber C in S7. Next, a test mold is loaded into the chamber C and attached to the mold head 11 in S8. The test mold can be, for example, a blank mold without a pattern. Further, in S9, the test substrate W2 placed on the retaining portion 24 is conveyed onto the stage 12 by the conveying device 26, so that the test substrate W2 is held on the stage 12. Next, in S10, an imprint process (dummy imprint) using the test mold is executed on the test substrate W2. When a plurality of shot regions are formed on the test substrate W2, the dummy imprint is executed on each of the plurality of shot regions.

Thereafter, in S11, the stage 12 holding the substrate W2 is moved to the inspection position of the inspection device 6, and defect inspection is performed by the inspection device 6. As described above, for example, the inspection device 6 irradiates the test substrate W2 with illumination light while scanning the test substrate W2, thereby irradiating the entire surface of the test substrate W2 with the illumination light and capturing an image of the test substrate W2. The image captured by the inspection device 6 is transferred to the controller 7. The controller 7 processes the image as the inspection result provided by the inspection device 6 and determines whether or not to replace the chemical filter. For example, the controller 7 can evaluate the number of defects detected from the image and the size of the defect as evaluation items. For example, if the number of defects is less than a predetermined number and the size of the defect is less than a predetermined size, it is determined that the determination result satisfies the determination criterion (YES in S12), and it is determined that replacement of the chemical filter 18 is unnecessary (S13). On the other hand, if the number of defects is equal to or larger than the predetermined number or the size of at least one defect is equal to or larger than the predetermined size, it is determined that the determination result does not satisfy the determination criterion (NO in S12), and it is determined that replacement of the chemical filter 18 is necessary (S14).

The determination result in S13 or S14 is preferably notified to the user. For example, the determination result is displayed on an operation screen (not shown) or the like. By notifying the necessity of replacement, it is possible to promote the user to replace the chemical filter 18. In addition, by periodically performing the evaluation process as described above, it is possible to predict the replacement timing of the chemical filter based on the increasing tendency of the number of defects and that of the size of the defect.

Second Embodiment

Figure 5:
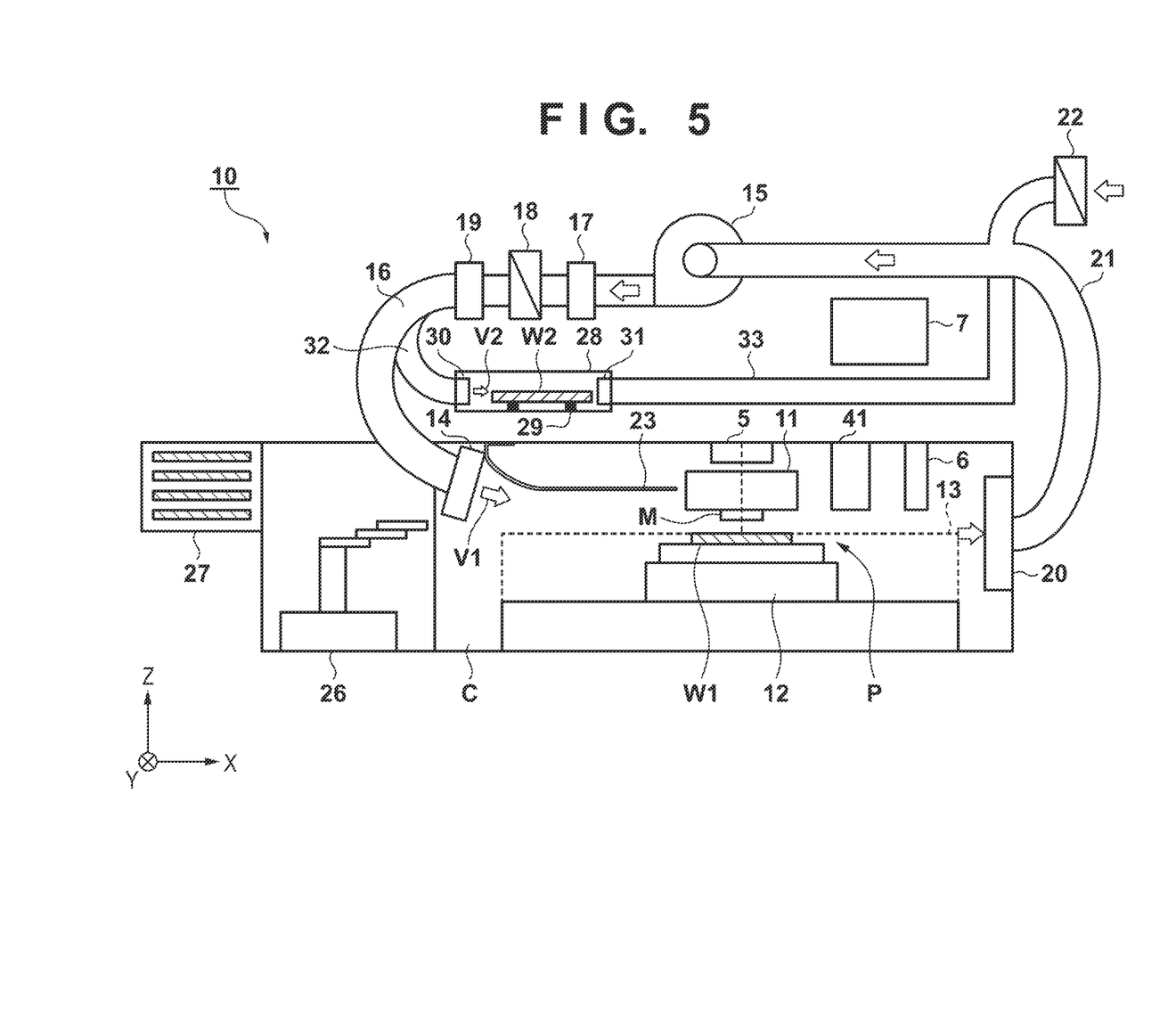
FIG. 5 is a view showing the arrangement of an imprint apparatus according to the second embodiment.

FIG. 5 is a view showing the arrangement of an imprint apparatus 10 according to the second embodiment. The same components as in FIG. 1 are denoted by the same reference numerals, and their descriptions will be omitted.

The retaining portion 24 is provided inside the chamber C in FIG. 1, but a retaining portion 28 is provided outside a chamber C in FIG. 5. The imprint apparatus 10 shown in FIG. 5 includes an air supply path 32 branching off from an air supply path 16, and the distal end of the air supply path 32 is connected to a blowout portion 30 provided at the supply port of the retaining portion 28.

On the side facing the blowout portion 30 of the retaining portion 28, an exhaust portion 31 is provided. An exhaust path 33 connected to the exhaust portion 31 is merged to an exhaust path 21. With this arrangement, the gas exhausted from the exhaust portion 31 is returned to the suction port of a blower 15 via the exhaust path 33 and the exhaust path 21.

Here, it is desirable that the environment in the retaining portion 28 is equal to that in the chamber C. Therefore, a flow velocity V2 of the gas blown out from the blowout portion 30 of the retaining portion 28 is adjusted so as to be equal to a flow velocity V1 of the gas blown out from a blowout portion 14 of the chamber C. By setting the flow velocities V1 and V2 to be equal, a test substrate W2 can be retained in an environment equal to the environment in the imprint space inside the chamber C, and the state of the chemical filter can be determined by the same evaluation method as in the first embodiment.

Third Embodiment

Figure 6:
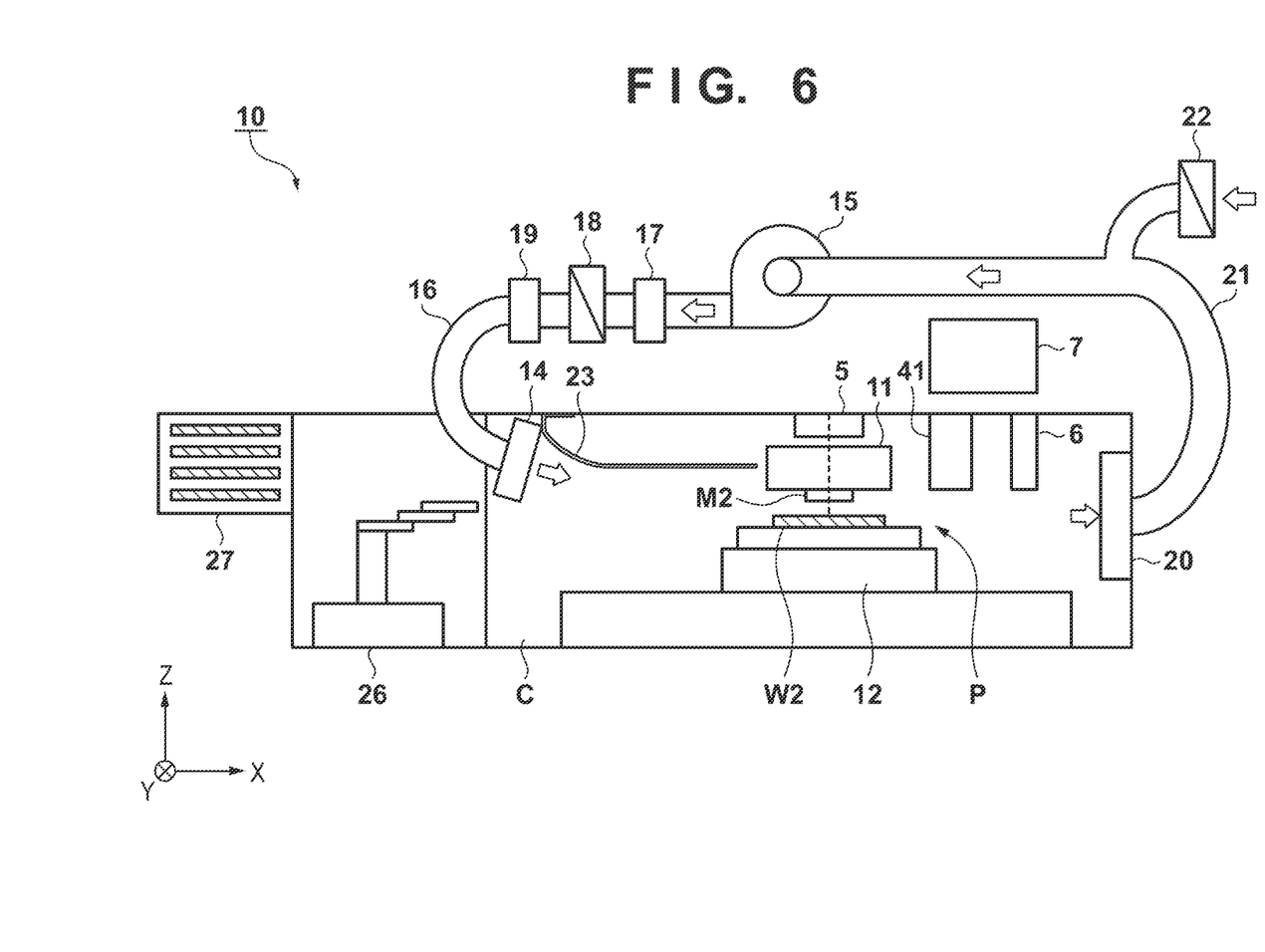
FIG. 6 is a view showing the arrangement of an imprint apparatus according to the third embodiment.

FIG. 6 is a view showing the arrangement of an imprint apparatus 10 according to the third embodiment. The same components as in FIG. 1 are denoted by the same reference numerals, and their descriptions will be omitted.

The retaining portion 24 is provided inside the chamber C in FIG. 1, but no retaining portion is provided in FIG. 6. In this case, a test mold M2 (blank mold) is set on a mold head 11, and a test substrate W2 is held on a stage 12. In this state, it is retained for the predetermined time assumed for an imprint process. Thereafter, the processing after S10 in FIG. 4 is executed and the state of a chemical filter 18 is evaluated.

According to this embodiment, a test substrate cannot be retained during a process for processing a substrate for mass production, but the state of the chemical filter 18 can be evaluated without separately providing the retaining portion 24.

Fourth Embodiment

The fourth embodiment is related to a planarized layer forming apparatus for executing a forming process for forming a planarized layer on a substrate. The planarized layer forming apparatus forms a planarized layer on a substrate by using a mold on which no pattern is formed (a planar template). The underlying pattern on the substrate has a concave/convex profile derived from a pattern formed in the previous step. More particularly, a process substrate may have a step of about 100 nm along with a multilayer structure of a recent memory element. The step derived from the moderate undulation of the entire surface of the substrate can be corrected by the focus tracking function of a scan exposure apparatus used in the photolithography process. However, the fine concave/convex portions having a small pitch and falling within the exposure slit area of the exposure apparatus directly consume the DOF (Depth Of Focus) of the exposure apparatus. As a conventional method of planarizing the underlying pattern of the substrate, a method for forming a planarized layer, such as SOC (Spin On Carbon) or CMP (Chemical Mechanical Polishing) is used. However, the conventional technique undesirably cannot obtain sufficient planarization performance, and the concave/convex difference of the underlayer by multilayer formation tends to increase.

To solve this problem, the planarized layer forming apparatus according to this embodiment presses the planar template (planar plate) against an uncured resist applied in advance to the substrate to perform local planarization within the substrate surface. In this embodiment, the arrangement of the planarized layer forming apparatus can be almost the same as that of the imprint apparatus 10 shown in FIG. 1. However, instead of the mold M, the planarized layer forming apparatus uses a planar plate of the same or larger area than a substrate W, and brings it into contact with the entire surface of the resist layer on the substrate W. A mold head 11 is configured to hold the planar plate.

Figure 7A:
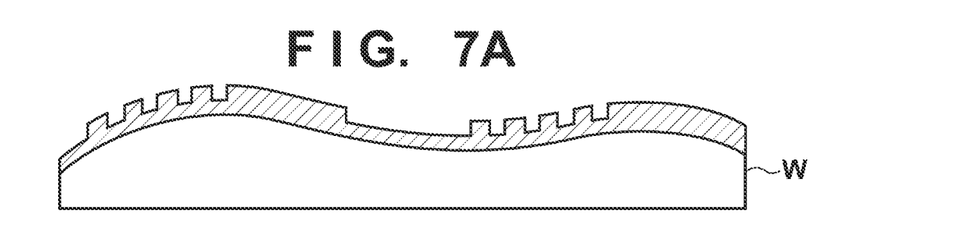
FIGS. 7A to 7D are views for explaining processing by a conventional planarized layer forming apparatus.
Figure 7B:
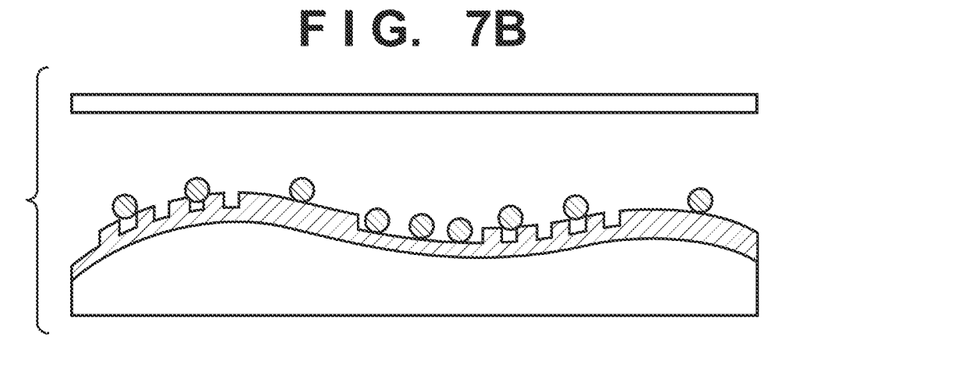
Figure 7C:
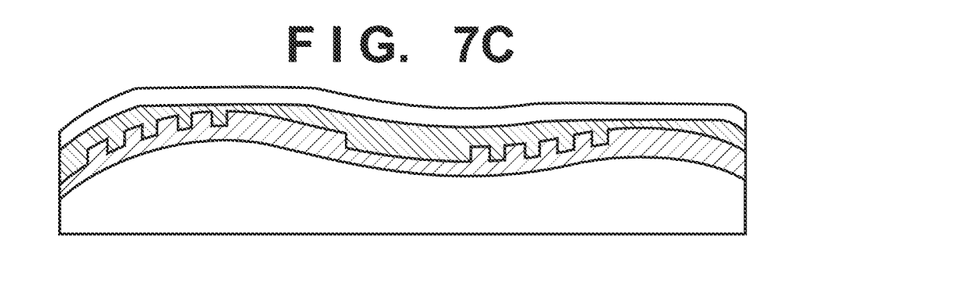
Figure 7D:
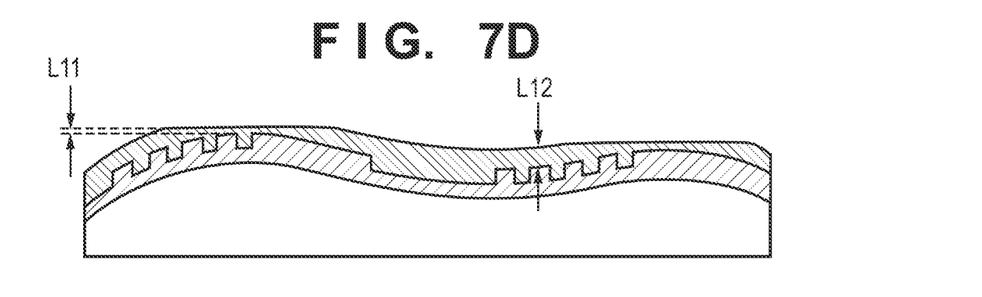

FIGS. 7A to 7D are views for explaining processing by a conventional planarized layer forming apparatus. FIG. 7A shows the substrate W before the processing. A hatched portion represents a pattern formed on the substrate W. FIG. 7B shows a state after the resist is supplied onto the substrate, but before the planar plate is brought into contact with the resist. This resist supply pattern is calculated under an assumption that there is no concave/convex portion on the entire surface of the substrate. FIG. 7C shows a state in which the planar plate perfectly contacts the resist on the substrate. FIG. 7D shows a state in which the planar plate is removed from the resist after the resist is irradiated with light and cured.

An actual substrate has not only a step of the pattern but also a concave/convex portion on the entire surface of the substrate. A timing at which the planar plate is brought into contact with resist varies due to the influence of the concave/convex portion. At the first position where the planar plate contacts the resist, the resist moves immediately after the contact, and the thickness of the resist is made smaller than the supposed thickness (L11 in FIG. 7D). At the last position where the planar plate contacts the resist, the start of resist movement is delayed, and the resist flowing from the peripheral portion is added to the resist, so that the thickness of the resist in this region is made larger than the supposed thickness (L12 in FIG. 7D).

Figure 8A:
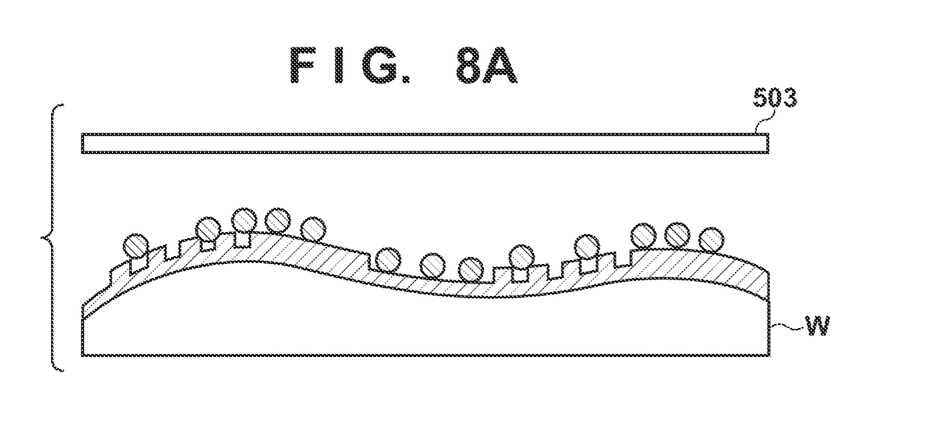
FIGS. 8A to 8C are views for explaining processing by a planarized layer forming apparatus according to the fourth embodiment.
Figure 8B:
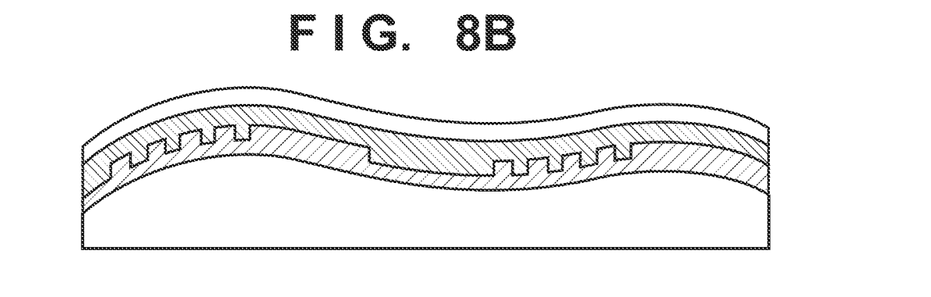
Figure 8C:
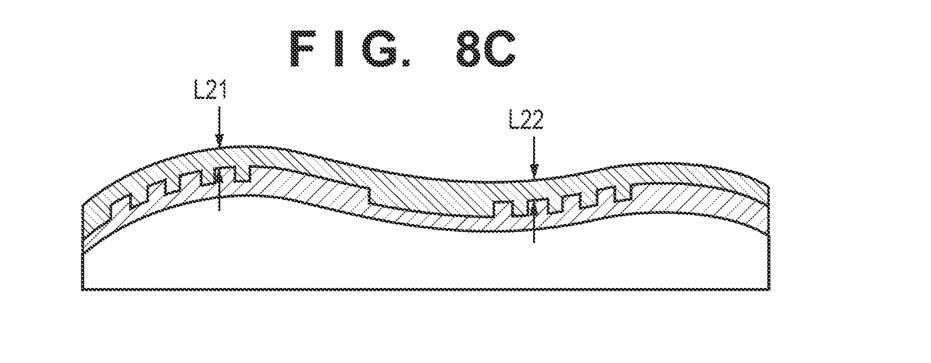

FIGS. 8A to 8C are views for explaining the processing by the planarized layer forming apparatus according to this embodiment. FIG. 8A shows a state after the resist is supplied onto the substrate, but before a planar plate 503 is brought into contact with the resist as in FIG. 7B. This resist supply pattern is calculated in consideration of the concave/convex information on the entire surface of the substrate. FIG. 8B shows a state in which the planar plate 503 perfectly contacts the resist on the substrate. FIG. 8C shows a state in which the planar plate 503 is removed from the resist after the resist is irradiated with light and cured.

As described above, an actual substrate has not only a step of the pattern but also a concave/convex portion on the entire surface of the substrate. A timing at which the planar plate 503 is brought into contact with resist varies due to the influence of the concave/convex portion. According to this embodiment, at the first position where the planar plate contacts the resist, the resist moves immediately after the contact, but a large amount of resist is arranged in accordance with the degree of resist movement. At the last position where the planar plate contacts the resist, the start of resist movement is delayed, and the resist flowing from the peripheral portion is added to the resist, so that the amount of resist is decreased in accordance with the degree of resist movement. According to this measure, a planarized layer having a uniform thickness on the entire surface of the substrate can be formed.

The method of evaluating the state of the chemical filter as described in the first embodiment can also be performed in the above-described planarized layer forming apparatus.

Embodiment of Method of Manufacturing Article

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

A method of manufacturing an article will be described next. In step SA of FIG. 9, a substrate 1z such as a silicon substrate with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 9:
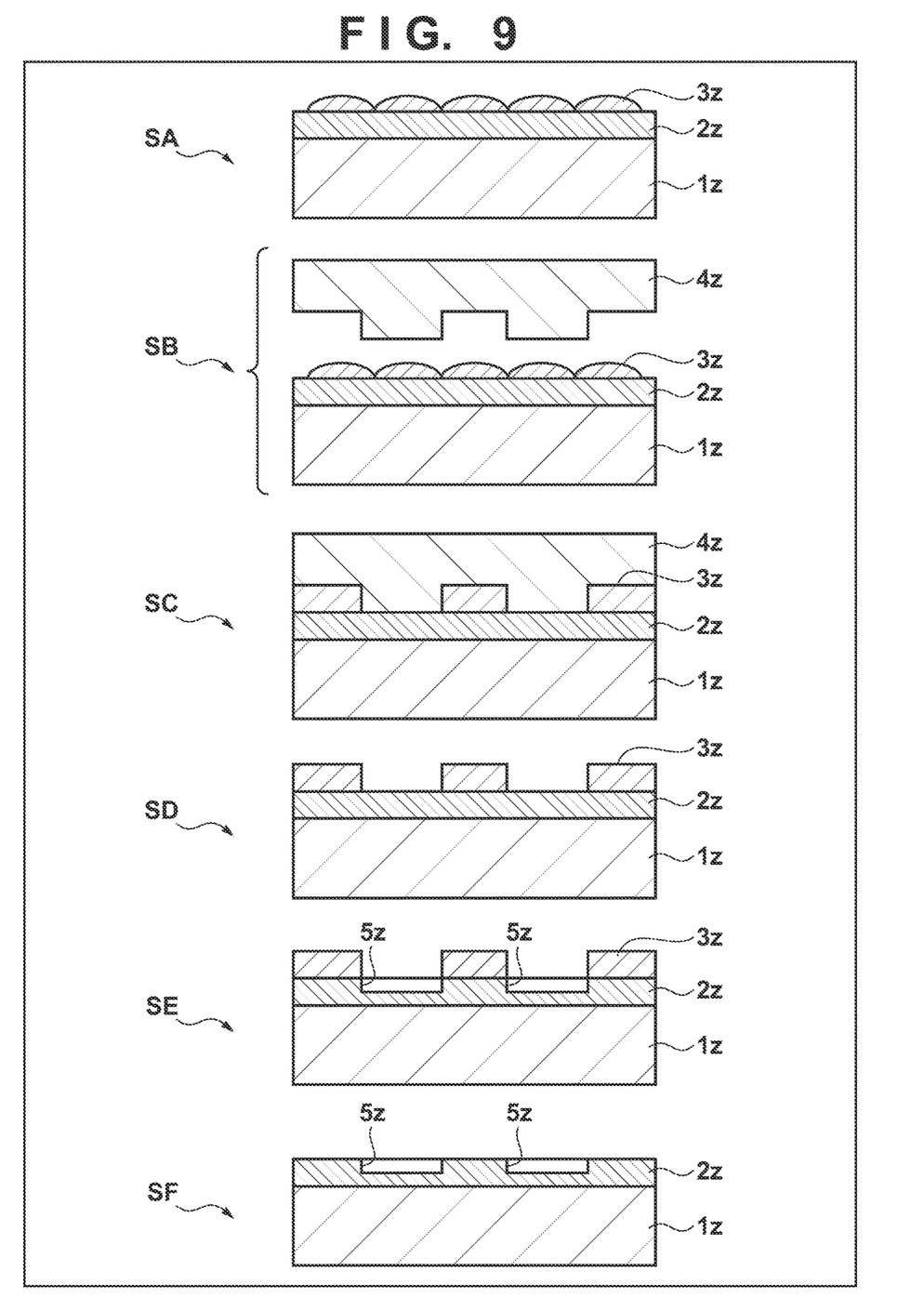
FIG. 9 is a view for explaining a method of manufacturing an article according to another embodiment.

In step SB of FIG. 9, a side of a mold 4z for imprint with an uneven pattern is directed to and caused to face the imprint material 3z on the substrate. In step SC of FIG. 9, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light serving as energy for curing via the mold 4z, the imprint material 3z is cured.

In step SD of FIG. 9, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

In step SE of FIG. 9, when etching is performed using the pattern of the cured product as an etching resistant mold, a portion of the surface of the processed material 2z where the cured product does not exist or remains thin is removed to form a groove 5z. In step SF of FIG. 9, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-071042, filed Apr. 2, 2018, which is hereby incorporated by reference herein in its entirety.

What is claimed is:

1. A method of managing an imprint apparatus that comprises a processor configured to execute an imprint process, a chamber configured to accommodate the processor, and a chemical filter configured to remove a chemical impurity contained in a gas that is to be introduced into the chamber, the method comprising:
   retaining a test substrate inside the chamber during execution of a first imprint process in which a first layer of an imprint material is formed on a production substrate;
   forming a second layer of an imprint material on the test substrate by executing a second imprint process on the test substrate by the processor after retaining the test substrate inside the chamber during the execution of the first imprint process in which the first layer is formed on the production substrate;
   inspecting the second layer formed on the test substrate in the second imprint process; and
   determining whether or not to replace the chemical filter configured to remove the chemical impurity contained in the gas that is to be introduced into the chamber based on an inspection result of the second layer formed on the test substrate in the second imprint process.

2. The method according to claim 1, wherein
   the imprint apparatus further comprises a retaining portion provided at a position between a gas supply port provided in the chamber and the processor and being configured to retain a substrate, and
   in the retaining, the test substrate is retained by the retaining portion during execution of the first imprint process.

3. The method according to claim 1, wherein
   the second imprint process in the forming the second layer is executed using a blank mold without a pattern,
   the inspecting the second layer includes capturing an image of the second layer formed on the test substrate by the second imprint process using the blank mold in the forming the second layer, and
   in the determining, whether or not to replace the chemical filter is determined by evaluating a defect of the second layer based on the image captured in the inspecting.

4. The method according to claim 3, wherein in the determining, in a case where a number of defects detected based on the image is not less than a predetermined number, or in a case where size of at least one defect is not less than a predetermined size, it is determined that replacement of the chemical filter is necessary.

5. The method according to claim 1, further comprising notifying a user of a determination result obtained in the determining.

6. The method according to claim 4, wherein respective steps in the method are repeatedly executed, and a replacement timing of the chemical filter is predicted based on an increasing tendency of the number of defects or an increasing tendency of the size of a defect.

7. The method according to claim 2, wherein the retaining portion is provided at a position aligned with the processor along an airflow formed by a gas supplied from the supply port.

8. A method of managing a planarized layer forming apparatus that comprises a processor configured to execute a forming process, a chamber configured to accommodate the processor, and a chemical filter configured to remove a chemical impurity contained in a gas that is to be introduced into the chamber, the method comprising:
   retaining a test substrate inside the chamber during execution of a first forming process in which a first planarized layer is formed on a production substrate;
   forming a second planarized layer on the test substrate by executing a second forming process on the test substrate by the processor after retaining the test substrate inside the chamber during the execution of the first forming process in which the first planarized layer is formed on the production substrate;
   inspecting the second planarized layer formed on the test substrate in the second forming process; and
   determining whether or not to replace the chemical filter configured to remove the chemical impurity contained in the gas that is to be introduced into the chamber based on an inspection result of the second planarized layer formed on the test substrate in the second forming process.

9. A method of manufacturing an article comprising:
   forming a pattern on a substrate using an imprint apparatus; and
   processing the substrate on which the pattern is formed in the forming, and
   the method manufacturing an article from the substrate processed in the processing, wherein
   the imprint apparatus comprises
   a processor configured to execute an imprint process for forming a layer of an imprint material on a substrate by using a mold,
   a chamber configured to accommodate the processor,
   a chemical filter configured to remove a chemical impurity contained in a gas that is to be introduced into the chamber, and
   a retaining portion provided at a position between a gas supply port provided in the chamber and the processor and configured to retain, during execution of the imprint process, a test substrate for determining whether or not to replace the chemical filter.

10. A method of determining whether or not to replace a chemical filter of an apparatus that comprises a processor configured to execute a process, a chamber configured to accommodate the processor, and a chemical filter configured to remove a chemical impurity contained in a gas that is to be introduced into the chamber, the method comprising:
    retaining a test substrate inside the chamber during execution of a first process on a production substrate;
    processing the test substrate by executing a second process on the test substrate by the processor after retaining the test substrate inside the chamber during the execution of the first process on the production substrate;
    inspecting the test substrate after the second process has been executed on the test substrate; and
    determining whether or not to replace the chemical filter configured to remove the chemical impurity contained in the gas that is to be introduced into the chamber based on an inspection result of the test substrate on which the second process has been executed.

* * * * *